(12) United States Patent
She

(10) Patent No.: US 10,438,916 B2
(45) Date of Patent: Oct. 8, 2019

(54) WIRE BOND CONNECTION WITH INTERMEDIATE CONTACT STRUCTURE

(71) Applicant: Intel Corporation, Santa Clara, CA (US)

(72) Inventor: Yong She, Songjiang (CN)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/078,579

(22) PCT Filed: Apr. 1, 2016

(86) PCT No.: PCT/CN2016/078363
§ 371 (c)(1),
(2) Date: Aug. 21, 2018

(87) PCT Pub. No.: WO2017/166308
PCT Pub. Date: Oct. 5, 2017

(65) Prior Publication Data
US 2019/0051627 A1    Feb. 14, 2019

(51) Int. Cl.
*H01L 23/48* (2006.01)
*H01L 23/52* (2006.01)
(Continued)

(52) U.S. Cl.
CPC ............ *H01L 24/48* (2013.01); *H01L 21/565* (2013.01); *H01L 23/48* (2013.01); *H01L 24/05* (2013.01);
(Continued)

(58) Field of Classification Search
CPC ... H01L 2224/3265; H01L 2224/48227; H01L 2224/32145; H01L 2224/48145;
(Continued)

(56) References Cited

U.S. PATENT DOCUMENTS 7,436,062 B2 * 10/2008 Kainuma .............. H01L 21/563
257/737
8,198,737 B2    6/2012 Zhang et al.
(Continued)

FOREIGN PATENT DOCUMENTS

CN    101924046    12/2010
KR    20090011564    2/2009
(Continued)

OTHER PUBLICATIONS

International Search Report and Written Opinion for International Patent Application No. PCT/CN2016/078363 dated Dec. 29, 2016, 12 pgs.

*Primary Examiner* — S. V. Clark
(74) *Attorney, Agent, or Firm* — Schwabe, Williamson & Wyatt, P.C.

(57) ABSTRACT

Techniques and mechanisms for provide interconnection with integrated circuitry. In an embodiment, a packaged device includes a substrate and one or more integrated circuit (IC) dies. A first conductive pad is formed at a first side of a first IC die, and a second conductive pad is formed at a second side of the substrate or another IC die. Wire bonding couples a wire between the first conductive pad and the second conductive pad, wherein a distal end of the wire is bonded, via a bump, to an adjoining one of the first conductive pad and the second conductive pad. A harness of the bump, which is less than a hardness of the wire, mitigates damage to the adjoining pad that might otherwise occur as a result of wire bonding stresses. In another embodiment, the wire includes copper (Cu) and the bump includes gold (Au) or silver (Ag).

20 Claims, 7 Drawing Sheets

(51) Int. Cl.
*H01L 29/40* (2006.01)
*H01L 23/00* (2006.01)
*H01L 25/065* (2006.01)
*H01L 25/00* (2006.01)
*H01L 21/56* (2006.01)

(52) U.S. Cl.
CPC .......... *H01L 24/85* (2013.01); *H01L 25/0657* (2013.01); *H01L 25/50* (2013.01); *H01L 24/32* (2013.01); *H01L 24/33* (2013.01); *H01L 24/45* (2013.01); *H01L 24/73* (2013.01); *H01L 2224/04042* (2013.01); *H01L 2224/05624* (2013.01); *H01L 2224/05655* (2013.01); *H01L 2224/05664* (2013.01); *H01L 2224/32145* (2013.01); *H01L 2224/32225* (2013.01); *H01L 2224/33181* (2013.01); *H01L 2224/45147* (2013.01); *H01L 2224/48091* (2013.01); *H01L 2224/48106* (2013.01); *H01L 2224/48145* (2013.01); *H01L 2224/48147* (2013.01); *H01L 2224/48227* (2013.01); *H01L 2224/48453* (2013.01); *H01L 2224/48464* (2013.01); *H01L 2224/48839* (2013.01); *H01L 2224/48844* (2013.01); *H01L 2224/73215* (2013.01); *H01L 2224/73265* (2013.01); *H01L 2224/85* (2013.01); *H01L 2224/85203* (2013.01); *H01L 2224/85205* (2013.01); *H01L 2225/0651* (2013.01); *H01L 2225/06506* (2013.01); *H01L 2225/06562* (2013.01); *H01L 2225/06586* (2013.01); *H01L 2924/181* (2013.01)

(58) Field of Classification Search
CPC .......... H01L 24/81; H01L 2224/04042; H01L 2224/73215; H01L 24/33
USPC ........ 257/686, 777, 784, 786; 438/107, 109, 438/110
See application file for complete search history.

(56) References Cited

U.S. PATENT DOCUMENTS

| | | | |
|---|---|---|---|
| 2002/0115356 A1* | 8/2002 | Baker | H01L 23/3107 439/886 |
| 2005/0242446 A1* | 11/2005 | Jin | H01L 24/03 257/779 |
| 2009/0236742 A1 | 9/2009 | Low | |
| 2010/0258930 A1* | 10/2010 | Oh | H01L 23/3128 257/686 |
| 2011/0074019 A1 | 3/2011 | Yasunaga et al. | |
| 2011/0079890 A1* | 4/2011 | Song | H01L 23/16 257/686 |
| 2012/0228759 A1 | 9/2012 | Fan | |

FOREIGN PATENT DOCUMENTS

| | | |
|---|---|---|
| TW | I252571 | 4/2006 |
| TW | 201533815 | 9/2015 |

* cited by examiner

WIRE BOND CONNECTION WITH INTERMEDIATE CONTACT STRUCTURE

CROSS-REFERENCE TO RELATED APPLICATION

This patent application is a U.S. National Phase Application under 35 U.S.C. § 371 of International Application No. PCT/CN2016/078363, filed Apr. 1, 2016, entitled "WIRE BOND CONNECTION WITH INTERMEDIATE CONTACT STRUCTURE," which designates the U.S., the entire disclosure of which is hereby incorporated by reference in its entirety and for all purposes.

BACKGROUND

1. Technical Field

Embodiments described herein generally relate to packaged integrated circuit devices, and more particularly, but not exclusively, to providing connection with an integrated circuit die of a packaged device.

2. Background Art

A typical packaged integrated circuit (IC) device includes one or more IC dies, a substrate and a package material that protects the substrate and one or more IC dies. The substrate includes conductive interconnects to variously route power, ground, and signals between the one or more IC die and external structure (such as a printed circuit board) coupled to the packaged IC device. A package is typically connected to such external structure by a hardware interface including a set of input/output (I/O) contacts such as an array of conductive pins, solder balls or the like.

Wire bonding techniques are often used for connecting integrated circuitry that is to be included in a packaged IC device. Some types of wire bonding variously apply heat, pressure and/or ultrasonic energy to weld a bond wire to a bonding pad. One drawback of these types of processes is the tendency of bonding pads to peel or crack during welding. Such defects may adversely affect processing yields and/or the reliability of packaged IC devices.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1:
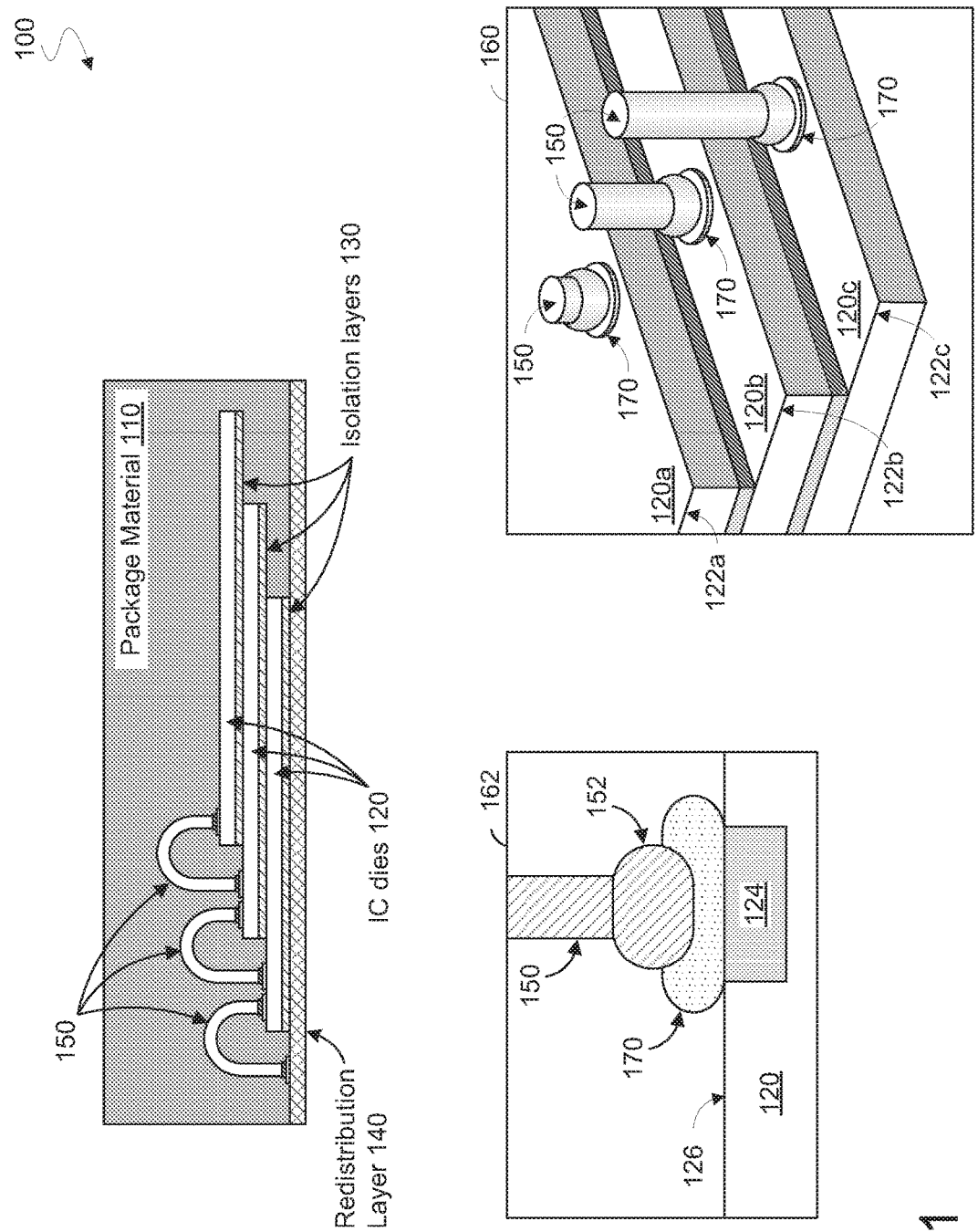
FIG. 1 shows a cross-sectional diagram illustrating elements of a packaged device including interconnect structures according to an embodiment.

Embodiments discussed herein variously include techniques and/or mechanisms to provide interconnection with an integrated circuit (IC) die of a packaged device. The electronic assemblies, packages and methods described herein address drawbacks that are associated with using wire bond packaging technology to form a weld with relatively hard interconnect materials. For example, copper (Cu) wire is widely used due to its relatively low material cost, high electrical conductivity and capacity to enable a high bond force. However, wire bond processing for copper wire requires relatively high heat, pressure, etc., which in turn is more likely to crack, peel or otherwise damage the metal (e.g., aluminum) of the pad to which the copper wire is bonded. Using thicker, more damage-resistant bonding pads can increase wafer fabrication costs, and can pose other fabrication processing challenges.

To date, copper wire bonding is mostly limited to die-to-substrate or side-by-side die-to-die bonding. Extending the application copper wire for die-to-die cascade bonding (i.e., for a stack of IC dies) has had limited technical success. Some embodiments described herein variously improve the applicability of copper (or other) wire bonding for interconnecting integrated circuitry of an IC die stack. Due to better signal routing possibilities, stacked die-to-die bonding is preferred for applications such as multi-die NAND packaging.

Unless otherwise indicated, the term "pad" refers herein to a conductive contact that is bonded (or is to be bonded) to a wire via a second conductive contact which, for distinction, is referred to herein as a "bump." A bump may be disposed on and adjoin a corresponding pad, wherein a relative softness of the bump, as compared to the hardness of the wire, mitigates damage to the pad that might otherwise occur as a result of a wire bonding process. The hardness of a bump may be less than that of the corresponding wire and, in some embodiments, less than the hardness of the adjoining pad.

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of an IC die or substrate, regardless of the orientation of the IC die or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the IC die or substrate, regardless of the orientation of the wafer or substrate.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. Such devices may be portable or stationary. In some embodiments the technologies described herein may be employed in a desktop computer, laptop computer, smart phone, tablet computer, netbook computer, notebook computer, personal digital assistant, server, combinations thereof, and the like. More generally, the technologies described herein may be employed in any of a variety of electronic devices including one or more packaged IC devices.

FIG. 1 shows a cross-sectional side view of a device 100 that provides interconnection with an IC die according to an embodiment. Device 100 may be any of a variety of packaged IC devices such as one including, for example, packaged processor circuitry, memory, controller logic, a system-in-package (SIP) and/or the like. Device 100 is merely one example of a packaged device, according to an embodiment, which includes one or more IC dies and a substrate, wherein a wire bond interconnect provides connection of one such IC die to the substrate or to another IC die. However, packaged devices according to other embodiments may include any of a variety of other combinations of a substrate and more, fewer and/or differently arranged IC dies—e.g., wherein a packaged device includes only one IC die or IC dies arranged in a side-by-side configuration.

The device 100 shown in FIG. 1 includes a stack comprising overlapping IC dies 120—e.g., where some or all IC dies 120 each has an upper surface coupled to a respective portion of wire (or "wire portion") that is to aid in connection to a substrate or another such IC die 120. By way of illustration and not limitation, a plurality of wire portions 150 may each extend from an upper surface of a respective one of IC dies 120—e.g., where the portion is not overlapped by any other one of IC dies 120. The wire portions 150 may variously extend within a package material 110 each between two respective IC dies 120 or, alternatively, between a respective IC die and a substrate (such as the illustrative redistribution layer 140).

Redistribution layer 140 may have disposed therein one or more traces, vias and/or other conductive structures—not shown—to provide for interconnection between different ones of wire portions 150 (and thus, interconnection with some or all of the one or more IC dies 120). In some embodiments, the stack further comprises isolation layers 130 including, for example, a dielectric material to aid in providing some electrical isolation between respective circuitry in or on different ones of the IC die 120. The number and configuration of IC dies 120 (and of isolation layers 130) is merely illustrative, and not limiting on certain embodiments.

The stack including IC dies 120 may be arranged in an overlapping configuration to enable connection of the plurality of wire portions 150 each to a respective one of the IC dies 120 at a point that is not covered by another of the IC dies 120. In the example embodiment illustrated in the cut-away detail view 160, stacked IC dies 120a, 120b, 120c (e.g., of IC dies 120) include respective sides 122a, 122b, 122c by which wire portions 150 are to be variously coupled. Cross-sectional detail view 162 shows an example of structure for one wire bond connection according to an embodiment. As shown in view 162, a pad 124 may be formed in or on a side 126 of an IC die 120—e.g., wherein pad 124 extends to side 126 and, in some embodiments, is at least partially recessed into side 126.

To facilitate improved connection of pad 124 to a distal end of wire portion 150, some embodiments variously provide a structure 170 (referred to herein as a "bump") that mitigates the possibility of damage to pad 124 that might otherwise happen as a result of wire bond processing. The sizes of bump 170, pad 124—e.g., relative to each other and/or relative to wire portion 150—are not necessarily to scale and/or may not be limiting on some embodiments. Although some embodiments are not limited in this regard, a distal end of a wire portion 150 may form spheroid portion 152 or other structure (not shown) that is relatively wide to improve electrical connection to pad 124 via bump 170—e.g., where a relatively narrow cylindrical or otherwise columnar section of that same wire portion 150 extends from spheroid portion 152. Wire portions 150 may variously couple to and extend each from a respective one of bumps 170 that are variously disposed each over a different respective one of pads 124. The wire portions 150 may variously extend from sides 122a, 122b, 122c through a package material (not shown in detail views 160, 162 to avoid obscuring certain features of some embodiments) such as package material 110.

It should be noted that the plurality of wire portions 150 may be arranged in any of a variety of manners on the upper surface of an IC die. The arrangement of the plurality of wire portions 150 on the upper surfaces 122a, 122b, 122c of the IC dies 120a, 120b, 120c will depend in part on the overall design of the IC die 120 as well as manufacturing consideration that are associated with fabricating the IC die 120 (among other factors).

Figure 2:
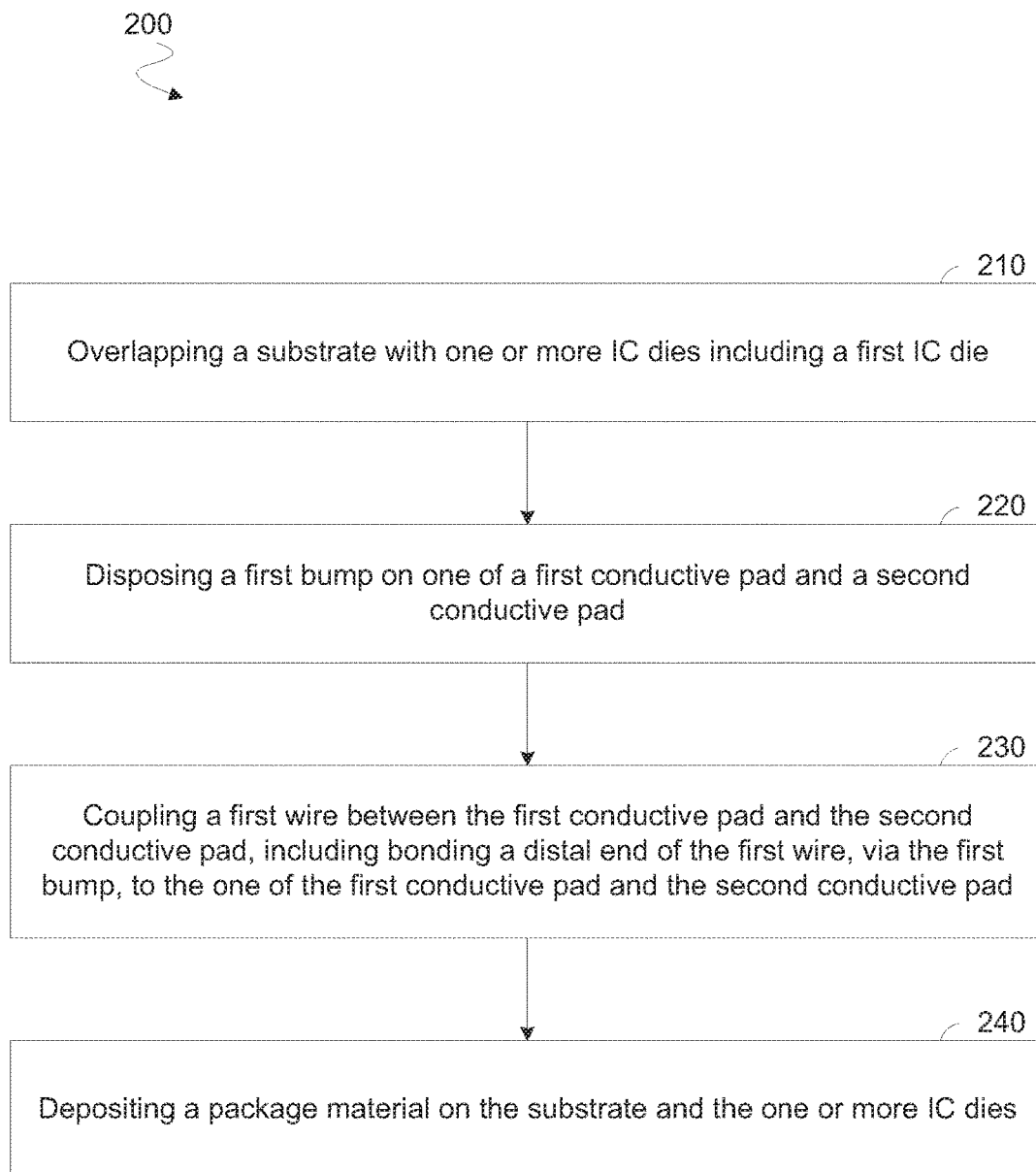
FIG. 2 is a flow diagram illustrating elements of a method for interconnecting integrated circuitry according to an embodiment.

FIG. 2 is a flow diagram illustrating an example method 200 for fabricating a package IC device according to an embodiment. The method 200 may provide a device having some of all of the features of packaged IC device 100, for example. Method 200 may include, at 210, overlapping a substrate with one or more IC dies which include a first IC die. The substrate may be that of an interposer, for example. The overlapping at 210 may include positioning the first IC die (or another IC die) on a side of the substrate. In an embodiment, a first conductive pad may be formed at a first side of the first IC die (e.g., one of sides 122a, 122b, 122c), wherein a second conductive pad is formed at a second side that is a side of the substrate or, alternatively, a side of an IC die other than the first IC die. A conductive pad of an IC die may provide for connection between transistors and/or other integrated circuitry of that IC die and circuitry that is remote from that IC die. For example, such a contact pad may be coupled through a metal stack of the IC die to a semiconductor substrate having formed therein or thereon active circuit components of the IC die.

Method 200 may further comprise, at 220, disposing a first bump on one of the first conductive pad and the second conductive pad. In one embodiment, the disposing at 220 is performed after the overlapping at 210. For example, bumps of a relatively soft metal (e.g., comprising gold or silver) may be variously deposited, each on a different respective pad, after the one or more IC dies are brought into position in an overlapping configuration with the substrate. In such an embodiment, wire bond processing to deposit such bumps (e.g., rather than semiconductor fabrication processing) may result in one or more bump dimensions each being multiple times larger than a corresponding pad dimension. For example, the thickness (z-height) of a bump—as measured in a direction orthogonal to the first side or the second side—may be at least twice a height of an adjoining pad. In one embodiment, the height of the bump is more than five times (e.g., ten times or more) the height of a pad which adjoins the bump. Alternatively or in addition, the total volume of a bump may be more than five times (e.g., more than ten times and, in some embodiments, more than twenty times) the total volume of an adjoining pad. By way of illustration and not limitation, a thickness of a pad may be in a range from 0.5 microns ($\mu m$) to 1.2 $\mu m$, wherein a thickness of an adjoining bump is at least 10 μm and, in some embodiments, 20 μm or more. The bump may have a height that is less than a thickness of an adjoining IC die, for example. However, the particular dimensions of pads and bumps may vary significantly according to implementation specific details.

In an embodiment, method 200 further comprises, at 230, coupling a first wire between the first conductive pad and the second conductive pad, including bonding a distal end of the first wire, via the first bump, to the one of the first conductive pad and the second conductive pad. In an embodiment, a first hardness of the first wire is more than a second hardness of the first bump. Alternatively or in addition, a third hardness of the one of the first conductive pad and the second conductive pad may be more than the second hardness of the first bump. In one illustrative embodiment, the first wire includes copper (Cu). Alternatively or in addition, one or both of the first conductive pad and the second conductive pad may include aluminum (Al), for example, or nickel palladium (NiPd). In such an embodiment, the first bump may be a comparatively softer metal, such as gold or silver.

Method 200 may further comprise, at 240, depositing a package material on the substrate and the one or more IC dies—e.g., after the coupling at 230. The depositing at 240 may include operations to encase the one or more IC dies in a mold compound—e.g., where such operations are adapted from conventional packaging techniques. Such conventional techniques are not limiting on some embodiments, and are not detailed herein to avoid obscuring certain features of various embodiments.

Figure 3:
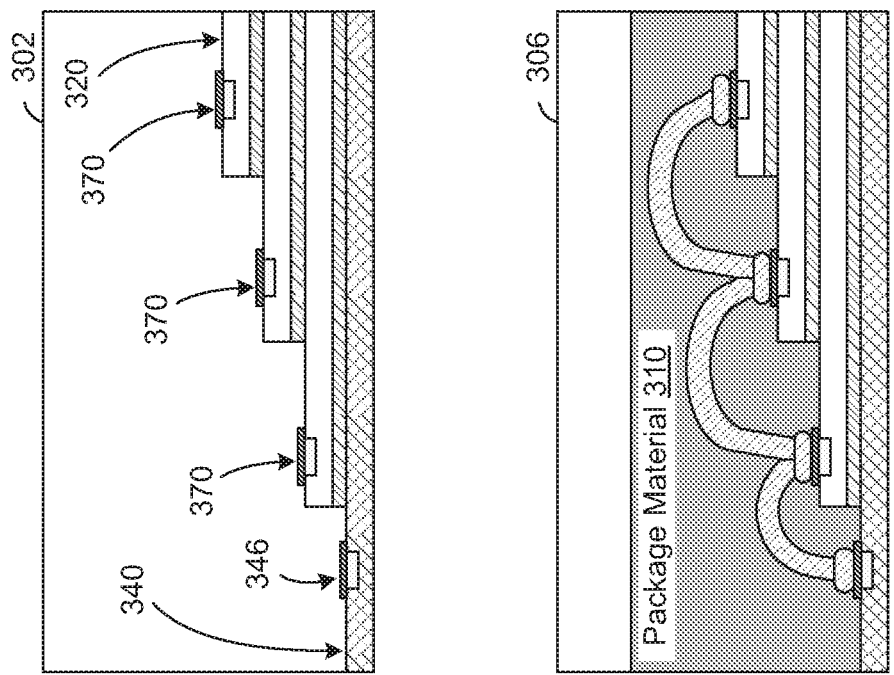
FIG. 3 shows cross-sectional diagrams variously illustrating respective operations to provide a packaged integrated circuit device according to an embodiment.

FIG. 3 shows cross-sectional views illustrating respective stages 300, 302, 304, 306 of processing to fabricate a packaged IC device according to an embodiment. Processing such as that shown in FIG. 3 may include some or all of the features of method 200, for example. In one illustrative embodiment, such processing fabricates hardware having features of device 100.

At stage 300, a stack (e.g., formed by processing such as that at 210 of method 200) includes an overlapping arrangement of a substrate 340 and one or more IC dies 320. In some embodiments, the stack further comprises isolation layers variously disposed between respective ones of IC dies 320. Some or all IC dies 320 may be variously staggered or otherwise configured to provide exposed surface regions of such IC dies 320—e.g., where a surface region of one of IC dies 320 is not directly covered by another of IC dies 320. These exposed surface regions may have disposed therein or thereon interface hardware, such as the illustrative pads 324, to facilitate connection of wires each to a respective one of IC dies 320. Substrate 340 may be that of an interposer or other structure which is to facilitate coupling of IC dies 320 to a hardware interface (not shown). The substrate 340 may be coupled directly or indirectly to one of IC dies 320—e.g., via an adhesive such as an electrically insulative epoxy or other such material. Substrate 340 may also have one or more pads, such as the illustrative pad 344, formed therein or thereon.

At stage 302, a plurality of bumps 370 may each be deposited on a different respective one of pads 324. Additionally or alternatively, another bump 346 may be formed on pad 344 of substrate 340. The formation of bumps 370, 346 may include some or all of the disposing at 220 of method 200. Although some embodiments are not limited in this regard, some or all of bumps 370, 346 may comprise solid metal structures that are variously pick placed or otherwise deposited on respective ones of pads 324, 344.

At stage 304, a plurality of wire portions 350 may be variously coupled each to a respective one of pads 324, 344 via an adjoining one of bumps 370, 346. By way of illustration and not limitation, for each of wire portions 350, opposite distal ends of the wire portion may be brought into contact with a different respective one of bumps 370, 346. Subsequently, heat, pressure and/or ultrasonic energy may be applied to bond the distal ends of the wire portion each via a respective one of bumps 370, 346 to an adjoining one of pads 324, 344. The formation of such welds may include operations adapted from otherwise conventional wire bonding techniques.

In an alternate embodiment, some or all of bumps 370, 346 may be variously coupled to respective ones of wires 150 prior to being disposed each on a respective one of pads 324, 344. For example, respective distal ends of wire portions 350 may each have a corresponding one of bumps 370, 346 formed thereon, after which wire portions 350 may be subsequently brought into position, along with bumps 370, 346, for bonding each to a respective pair of pads.

Subsequent processing may include, at stage 306, a package material 310 being disposed at least around IC dies 320 and wire portions 350. The package material 310 may be injection molded or otherwise deposited to extend around IC dies 320 and, in some embodiments, at least part of substrate 340. In the illustrative embodiment shown, package material 310 extends around and above a periphery of a stack of IC dies 320. Subsequent processing (not shown) may form a hardware interface that, for example, is coupled to IC dies 320 via interconnect structures that are formed within substrate 340.

Figure 4:
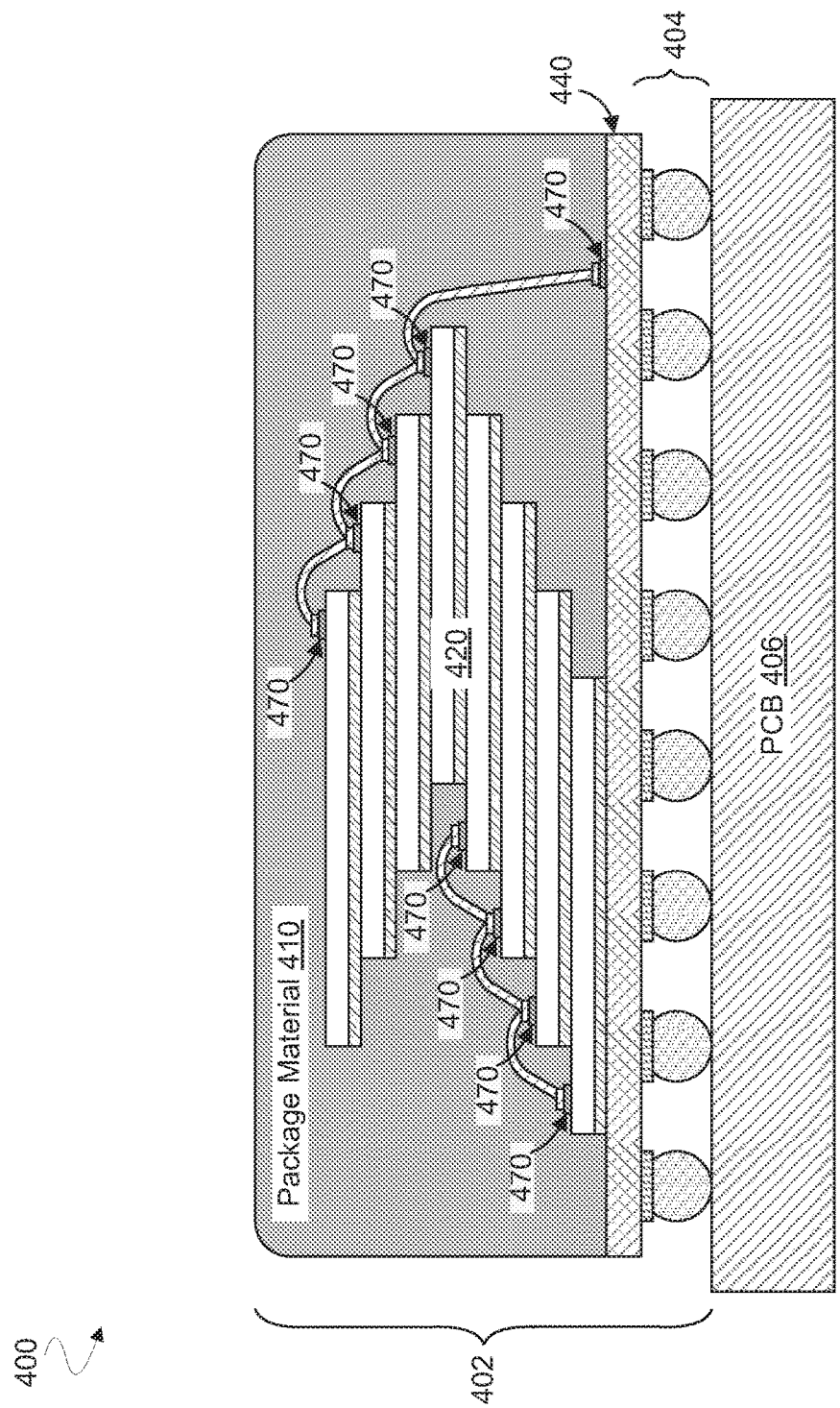
FIG. 4 shows a cross-sectional diagram of a packaged device including interconnect structures according to an embodiment.

FIG. 4 is a cross-sectional view showing features of a system 400 to provide interconnection with integrated circuitry according to one embodiment. System 400 may include interconnect structures such as those of device 100, for example. In an embodiment, processing to fabricate, assemble or otherwise provide structure of system 400 is according to method 200, System 400 includes a packaged integrated circuit (IC) device 402 and a printed circuit board PCB 406 coupled thereto via a hardware interface 404 (e.g., a ball grid array) of packaged IC device 402. Conductive contacts of hardware interface 404 may be variously connected, via an interposer 440, to integrated circuitry including, for example, and stack 420 of IC dies disposed in a package material 410 of device 402.

Wire bonds may variously couple IC dies of stack 420 with one another and/or with interposer 440. In an embodiment, bumps 470 are variously disposed each on a respective pad (not shown) at a side of a corresponding IC die. Bumps 470 may variously facilitate bonding of wires each to a respective one of such pads. For example, a relative softness of bumps 470—e.g., as compared to hardness of the such pads and/or a hardness of such wires—may mitigate damage to the pads that might otherwise occur during wire bonding processes. In an embodiment, some or all of bumps 470 each include gold and/or silver—e.g., where the wires comprise copper and the pads include aluminum.

Figure 5:
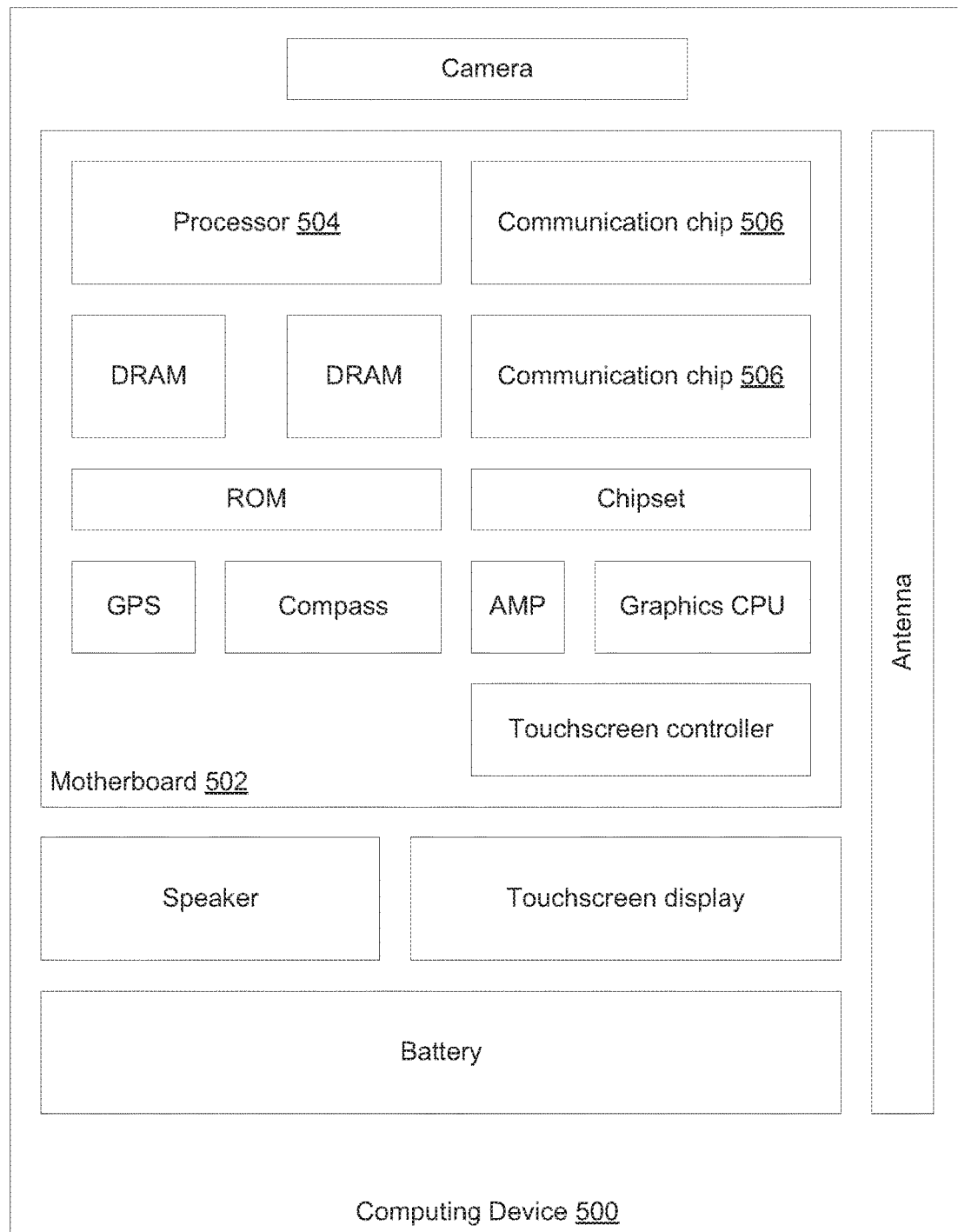
FIG. 5 is a functional block diagram of a computing device in accordance with one embodiment.

FIG. 5 illustrates a computing device 500 in accordance with one embodiment. The computing device 500 houses a board 502. The board 502 may include a number of components, including but not limited to a processor 504 and at least one communication chip 506. The processor 504 is physically and electrically coupled to the board 502 In some implementations the at least one communication chip 506 is also physically and electrically coupled to the board 502. In further implementations, the communication chip 506 is part of the processor 504.

Depending on its applications, computing device 500 may include other components that may or may not be physically and electrically coupled to the board 502. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LIE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. The term "processor" may refer to any device or portion of a device that processes electronic data from registers and/or memory to transform that electronic data into other electronic data that may be stored in registers and/or memory. The communication chip 506 also includes an integrated circuit die packaged within the communication chip 506.

In various implementations, the computing device 500 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 500 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
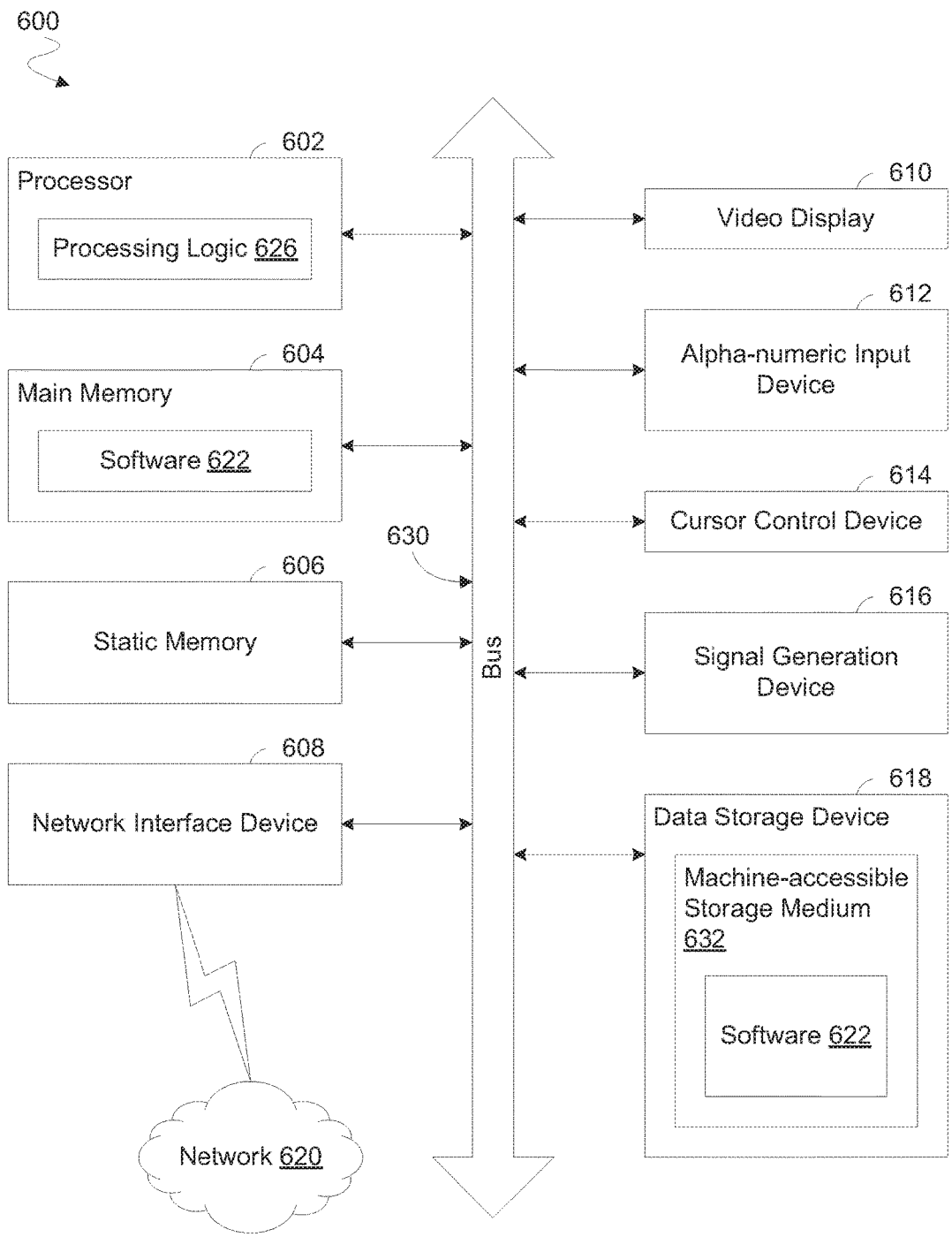
FIG. 6 illustrates a block diagram of an exemplary computer system, in accordance with an embodiment.

FIG. 6 illustrates a diagrammatic representation of a machine in the exemplary form of a computer system 600 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like, More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations described herein.

The computer system 600 may further include a network interface device 608. The computer system 600 also may include a video display unit 610 (e.g., a liquid crystal display (LCD), a light emitting diode display (LED), or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 632 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 632 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Figure 7:
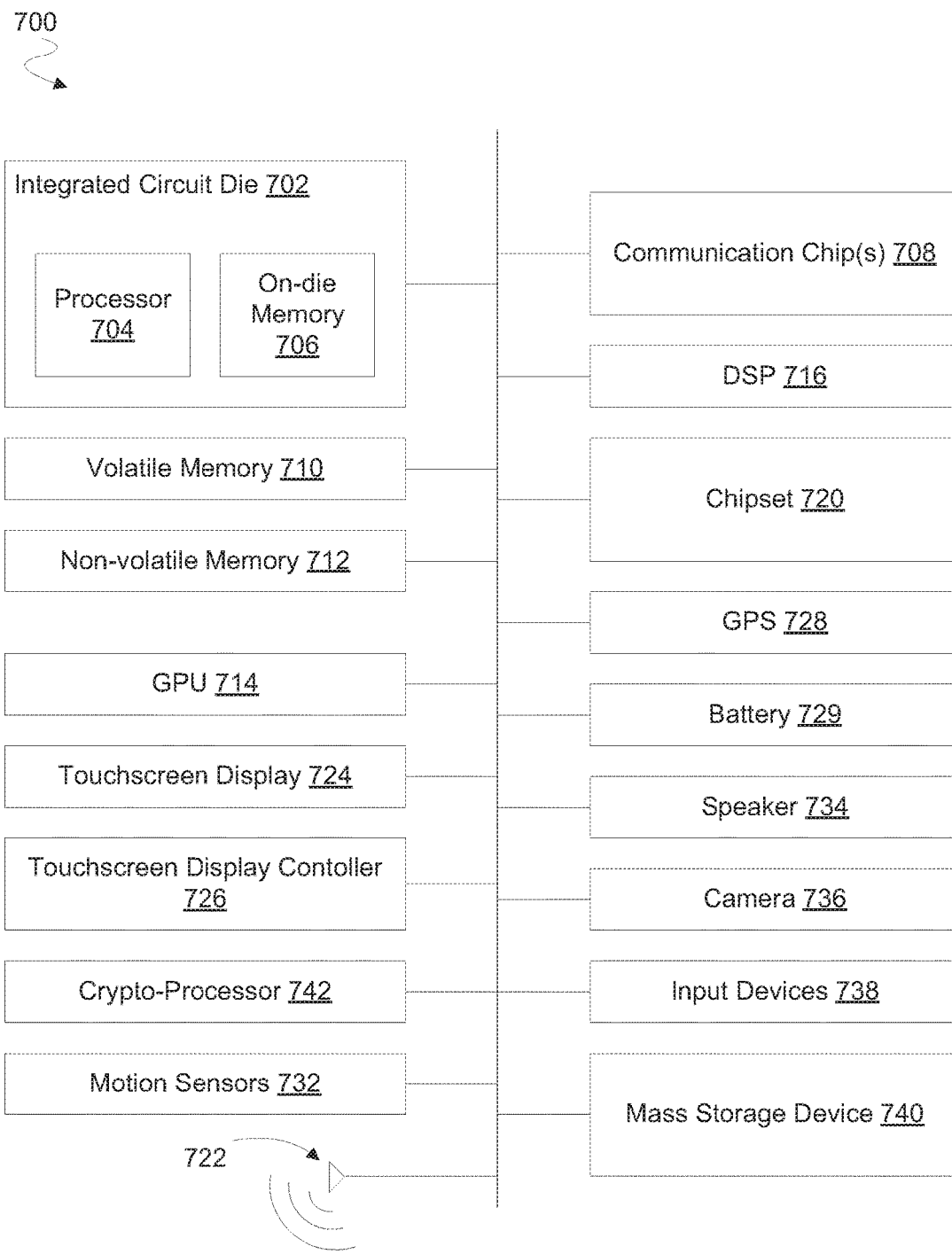
FIG. 7 is a functional block diagram of a computing device in accordance with an embodiment.

FIG. 7 illustrates a computing device 700 in accordance with one embodiment. The computing device 700 may include a number of components. In one embodiment, these components are attached to one or more motherboards. In an alternate embodiment, these components are fabricated onto a single system-on-a-chip (SoC) die rather than a motherboard. The components in the computing device 700 include, but are not limited to, an integrated circuit die 702 and at least one communication chip 708. In some implementations the communication chip 708 is fabricated as part of the integrated circuit die 702. The integrated circuit die 702 may include a CPU 704 as well as on-die memory 706, often used as cache memory, that can be provided by technologies such as embedded DRAM (eDRAM) or spin-transfer torque memory (STTM or STTM-RAM).

Computing device 700 may include other components that may or may not be physically and electrically coupled to the motherboard or fabricated within an SoC die. These other components include, but are not limited to, volatile memory 710 (e.g., DRAM), non-volatile memory 712 (e.g., ROM or flash memory), a graphics processing unit 714 (GPU), a digital signal processor 716, a crypto processor 742 (a specialized processor that executes cryptographic algorithms within hardware), a chipset 720, an antenna 722, a display or a touchscreen display 724, a touchscreen controller 726, a battery 729 or other power source, a power amplifier (not shown), a global positioning system (GPS) device 728, a compass 730, a motion coprocessor or sensors 732 (that may include an accelerometer, a gyroscope, and a compass), a speaker 734, a camera 736, user input devices 738 (such as a keyboard, mouse, stylus, and touchpad), and a mass storage device 740 (such as hard disk drive, compact disk (CD), digital versatile disk (DVD), and so forth).

The communications chip 708 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 708 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 708. For instance, a first communication chip 708 may be dedicated to shorter range wireless communications such as Wi-Fi. and Bluetooth and a second communication chip 708 may be dedicated to longer range wireless communications such as UPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory. In various embodiments, the computing device 700 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

In one implementation, a packaged integrated circuit (IC) device comprises a substrate, one or more IC dies including a first IC die, wherein a first conductive pad is formed at a first side of the first IC die, wherein the substrate or an IC die other than the first IC die includes a second side, and wherein a second conductive pad is formed at the second side, a first bump disposed on one of the first conductive pad and the second conductive pad, and a first wire coupled between the first conductive pad and the second conductive pad, wherein a distal end of the first wire is bonded via the first bump to the one of the first conductive pad and the second conductive pad, wherein a first hardness of the first wire is more than a second hardness of the first bump and wherein a third hardness of the one of the first conductive pad and the second conductive pad is more than the second hardness.

In an embodiment, the first wire includes copper (Cu), In another embodiment, the first bump includes gold (Au) or silver (Ag). In another embodiment, the one of the first conductive pad and the second conductive pad includes aluminum (Al). In another embodiment, the one of the first conductive pad and the second conductive pad includes aluminum (Al) or nickel palladium (NiPd). In another embodiment, a total volume of the first bump is more than five times a total volume of the one of the first conductive pad and the second conductive pad.

In another implementation, a method comprises overlapping a substrate with one or more integrated circuit (IC) dies including a first IC die, wherein a first conductive pad is formed at a first side of the first IC die, wherein the substrate or an IC die other than the first IC die includes a second side, and wherein a second conductive pad is formed at the second side, disposing a first bump on one of the first conductive pad and the second conductive pad, coupling a first wire between the first conductive pad and the second conductive pad, including bonding a distal end of the first wire, via the first bump, to the one of the first conductive pad and the second conductive pad, wherein a first hardness of the first wire is more than a second hardness of the first bump and wherein a third hardness of the one of the first conductive pad and the second conductive pad is more than the second hardness, and depositing a package material on the substrate and the one or more IC dies.

In an embodiment, the first wire includes copper Cu), In another embodiment, the first bump includes gold (Au) or silver (Ag). In another embodiment, the one of the first conductive pad and the second conductive pad includes aluminum (Al). In another embodiment, the one of the first conductive pad and the second conductive pad includes aluminum (Al) or nickel palladium (NiPd). In another embodiment, a total volume of the first bump is more than five times a total volume of the one of the first conductive pad and the second conductive pad. In another embodiment, disposing the first bump includes disposing after overlapping the substrate with the one or more IC dies.

In another implementation, a system comprises a packaged integrated circuit (IC) device including a substrate, one or more IC dies including a first IC die, wherein a first conductive pad is formed at a first side of the first IC die, wherein the substrate or an IC die other than the first IC die includes a second side, and wherein a second conductive pad is formed at the second side, a first bump disposed on one of the first conductive pad and the second conductive pad, and a first wire coupled between the first conductive pad and the second conductive pad, wherein a distal end of the first wire is bonded via the first bump to the one of the first conductive pad and the second conductive pad, wherein a first hardness of the first wire is more than a second hardness of the first bump and wherein a third hardness of the one of the first conductive pad and the second conductive pad is more than the second hardness. The system further comprises a display coupled to the packaged IC device, the display to generate an image based on signals exchanged by the first IC die.

In another embodiment, the first wire includes copper (Cu). In another embodiment, the first bump includes gold (Au) or silver (Ag). In another embodiment, the one of the first conductive pad and the second conductive pad includes aluminum (Al). In another embodiment, the one of the first conductive pad and the second conductive pad includes aluminum (Al) or nickel palladium (NiPd). In another embodiment, a total volume of the first bump is more than five times a total volume of the one of the first conductive pad and the second conductive pad.

Techniques and architectures for providing connectivity with an integrated circuit chip are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A packaged integrated circuit (IC) device comprising:
   a substrate;
   one or more IC dies including a first IC die, wherein a first conductive pad is formed at a first side of the first IC die, wherein the substrate or an IC die other than the first IC die includes a second side, and wherein a second conductive pad is formed at the second side;
   a first bump disposed on one of the first conductive pad and the second conductive pad; and
   a first wire coupled between the first conductive pad and the second conductive pad, wherein a distal end of the first wire is bonded via the first bump to the one of the first conductive pad and the second conductive pad, wherein a first hardness of the first wire is more than a second hardness of the first bump and wherein a third hardness of the one of the first conductive pad and the second conductive pad is more than the second hardness.

2. The packaged IC device of claim 1, wherein the first wire includes copper (Cu).

3. The packaged IC device of claim 2, wherein the first bump includes gold (Au) or silver (Ag).

4. The packaged IC device of claim 3, wherein the one of the first conductive pad and the second conductive pad includes aluminum (Al).

5. The packaged IC device of claim 1, wherein the one of the first conductive pad and the second conductive pad includes aluminum (Al) or nickel palladium (NiPd).

6. The packaged IC device of claim 1, wherein the first bump includes gold (Au) or silver (Ag).

7. The packaged IC device of claim 1, wherein a total volume of the first bump is more than five times a total volume of the one of the first conductive pad and the second conductive pad.

8. A method comprising:
   overlapping a substrate with one or more integrated circuit (IC) dies including a first IC die, wherein a first conductive pad is formed at a first side of the first IC die, wherein the substrate or an IC die other than the first IC die includes a second side, and wherein a second conductive pad is formed at the second side;
   disposing a first bump on one of the first conductive pad and the second conductive pad;
   coupling a first wire between the first conductive pad and the second conductive pad, including bonding a distal end of the first wire, via the first bump, to the one of the first conductive pad and the second conductive pad, wherein a first hardness of the first wire is more than a second hardness of the first bump and wherein a third hardness of the one of the first conductive pad and the second conductive pad is more than the second hardness; and
   depositing a package material on the substrate and the one or more IC dies.

9. The method of claim 8, wherein the first wire includes copper (Cu).

10. The method of claim 9, wherein the first bump includes gold (Au) or silver (Ag).

11. The method of claim 10, wherein the one of the first conductive pad and the second conductive pad includes aluminum (Al).

12. The method of claim 8, wherein the one of the first conductive pad and the second conductive pad includes aluminum (Al) or nickel palladium (NiPd).

13. The method of claim 8, wherein the first bump includes gold (Au) or silver (Ag).

14. The method of claim 8, wherein a total volume of the first bump is more than five times a total volume of the one of the first conductive pad and the second conductive pad.

15. The method of claim 8, wherein disposing the first bump includes disposing after overlapping the substrate with the one or more IC dies.

16. A system comprising:
   a packaged integrated circuit (IC) device including:
      a substrate;
      one or more IC dies including a first IC die, wherein a first conductive pad is formed at a first side of the first IC die, wherein the substrate or an IC die other than the first IC die includes a second side, and wherein a second conductive pad is formed at the second side;
      a first bump disposed on one of the first conductive pad and the second conductive pad; and
      a first wire coupled between the first conductive pad and the second conductive pad, wherein a distal end of the first wire is bonded via the first bump to the one of the first conductive pad and the second conductive pad, wherein a first hardness of the first wire is more than a second hardness of the first bump and wherein a third hardness of the one of the first conductive pad and the second conductive pad is more than the second hardness; and
   a display coupled to the packaged IC device, the display to generate an image based on signals exchanged by the first IC die.

17. The system of claim 16, wherein the first wire includes copper (Cu).

18. The system of claim 17, wherein the first bump includes gold (Au) or silver (Ag).

19. The system of claim 18, wherein the one of the first conductive pad and the second conductive pad includes aluminum (Al).

20. The system of claim 16, wherein the first bump includes gold (Au) or silver (Ag).

* * * * *